(12) United States Patent
Bonart

(10) Patent No.: US 10,541,212 B2
(45) Date of Patent: Jan. 21, 2020

(54) SEMICONDUCTOR ARRANGEMENT WITH A SEALING STRUCTURE

(71) Applicant: Infineon Technologies AG, Neubiberg (DE)

(72) Inventor: Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/852,314

(22) Filed: Dec. 22, 2017

(65) Prior Publication Data
US 2018/0182710 A1    Jun. 28, 2018

(30) Foreign Application Priority Data

Dec. 23, 2016    (DE) .......................... 10 2016 125 686

(51) Int. Cl.
*H01L 23/00*    (2006.01)
*H01L 23/58*    (2006.01)
*H01L 23/522*    (2006.01)

(52) U.S. Cl.
CPC ........ *H01L 23/562* (2013.01); *H01L 23/5226* (2013.01); *H01L 23/564* (2013.01); *H01L 23/585* (2013.01); *H01L 2224/05582* (2013.01); *H01L 2924/36* (2013.01)

(58) Field of Classification Search
CPC ... H01L 23/585; H01L 23/562; H01L 23/564; H01L 23/5226
USPC .................. 257/620, 758, E23.194; 438/462
See application file for complete search history.

(56) References Cited

U.S. PATENT DOCUMENTS

| 6,489,229 B1* | 12/2002 | Sheridan ................. H01L 24/03 257/E21.508 |
| 6,524,877 B1 | 2/2003 | Nakazawa et al. |
| 2004/0150070 A1* | 8/2004 | Okada ..................... H01L 22/32 257/508 |
| 2005/0045697 A1 | 3/2005 | Lacap et al. |
| 2005/0098893 A1* | 5/2005 | Tsutsue ................. H01L 23/564 257/758 |

(Continued)

FOREIGN PATENT DOCUMENTS

TW    200742021 A    11/2007

*Primary Examiner* — Mohammed Shamsuzzaman
*Assistant Examiner* — Aaron J Gray
(74) *Attorney, Agent, or Firm* — Murphy, Bilak & Homiller, PLLC

(57) ABSTRACT

A semiconductor arrangement includes a semiconductor body with a first surface, an inner region and an edge region, the edge region surrounding the inner region, an attachment layer spaced apart from the first surface of the semiconductor body in a first direction, an intermediate layer arranged between the first surface of the semiconductor body and the attachment layer, and at least one first type sealing structure. The sealing structure includes a first barrier, a second barrier, and a third barrier. The first barrier is arranged in the intermediate layer and spaced apart from the attachment layer in the first direction. The second barrier is arranged in the intermediate layer, is spaced apart from the first surface in the first direction, and is spaced apart from the first barrier in a second direction. The third barrier extends from the first barrier to the second barrier in the second direction.

18 Claims, 3 Drawing Sheets

(56) References Cited

U.S. PATENT DOCUMENTS

| | | | |
|---|---|---|---|
| 2009/0315184 A1* | 12/2009 | Tokitoh | H01L 23/522 |
| | | | 257/758 |
| 2009/0321890 A1 | 12/2009 | Jeng et al. | |
| 2011/0031581 A1* | 2/2011 | West | H01L 23/481 |
| | | | 257/508 |
| 2011/0156219 A1 | 6/2011 | Kawashima et al. | |
| 2012/0175728 A1* | 7/2012 | Yang | H01L 23/564 |
| | | | 257/508 |
| 2014/0134796 A1 | 5/2014 | Kelly et al. | |

* cited by examiner

SEMICONDUCTOR ARRANGEMENT WITH A SEALING STRUCTURE

BACKGROUND

Some types of semiconductor arrangements (which may also be referred to as semiconductor chips) include a semiconductor body, a layer stack with electrically insulating layers on top of a surface of the semiconductor body, and an attachment layer on top of the layer stack. The semiconductor body may include active regions of semiconductor devices, such as transistors, diodes, or the like. Conductors formed in the layer stack may form interconnections between devices integrated in the semiconductor body, and between semiconductor devices and contact pins. The contact pins may serve to connect the chip to another chip, a load, a power supply, or the like. The attachment layer may serve to attach, for example by soldering, another semiconductor chip or one or more electronic devices The semiconductor arrangement has an edge surface that laterally surrounds the semiconductor arrangement and terminates the semiconductor arrangement in horizontal directions. In order to prevent impurities from diffusing into active regions of the semiconductor body, the semiconductor arrangement may include a sealing structure. The sealing structure may completely extend through the layer stack and include an electrically conducting layer on top of the layer stack. It is desirable for the attachment layer to be electrically insulated from the conducting layer of the sealing structure.

There is therefore a need to provide a sealing structure that prevents impurity atoms from diffusing into active regions of a semiconductor body and does essentially not reduce the size of an area available for implementing an attachment layer.

SUMMARY

One example relates to a semiconductor arrangement. The semiconductor arrangement includes a semiconductor body with a first surface, an inner region and an edge region, wherein the edge region surrounds the inner region, an attachment layer spaced apart from the first surface of the semiconductor body in a first direction, an intermediate layer arranged between the first surface of the semiconductor body and the attachment layer, and at least one first type sealing structure. The sealing structure includes a first barrier, a second barrier, and a third barrier. The first barrier is arranged in the intermediate layer and spaced apart from the attachment layer in the first direction. The second barrier is arranged in the intermediate layer, is spaced apart from the first surface in the first direction, and is spaced apart from the first barrier in a second direction. The third barrier extends from the first barrier to the second barrier in the second direction.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
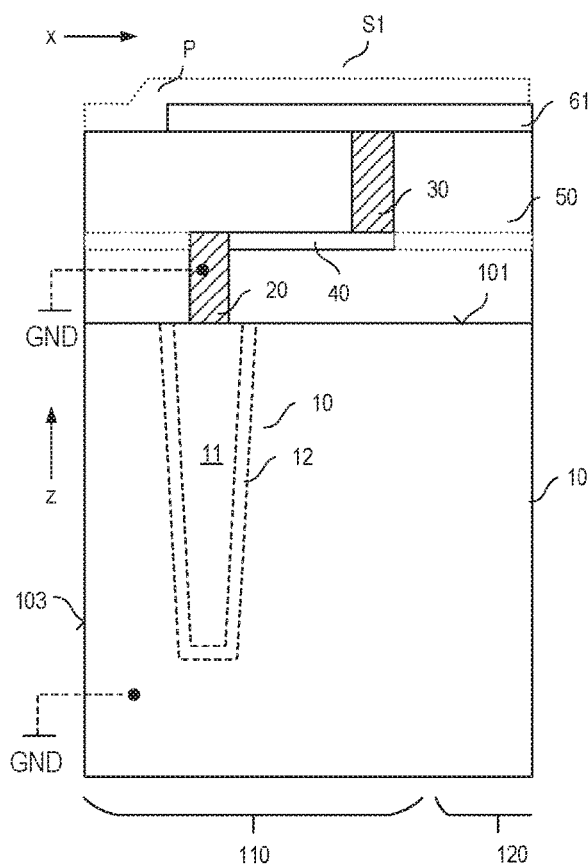
FIG. 1 shows a vertical cross-sectional view of a semiconductor arrangement that includes a first type sealing structure according to one example.

FIG. 1 shows a vertical cross-sectional view of one section of a semiconductor arrangement. This semiconductor arrangement includes a semiconductor body 100 with a first surface 101, an edge surface 103, an inner region 120, and an edge region 110. The edge region 110 is arranged between the inner region 120 and the edge surface 103. The first surface 101 terminates the semiconductor body 100 in a first vertical direction z, which is a direction perpendicular to the first surface 101, and the edge surface 103 terminates the semiconductor body 10) in horizontal directions, which are directions perpendicular to the vertical direction z. In FIG. 1, a first horizontal direction x is schematically illustrated. A second surface that is opposite the first surface 101 and terminates the semiconductor body 100 in a vertical direction opposite the direction z is not shown in FIG. 1. That is, the semiconductor body 100 may extend farther as illustrated in the second vertical direction.

Figure 3:
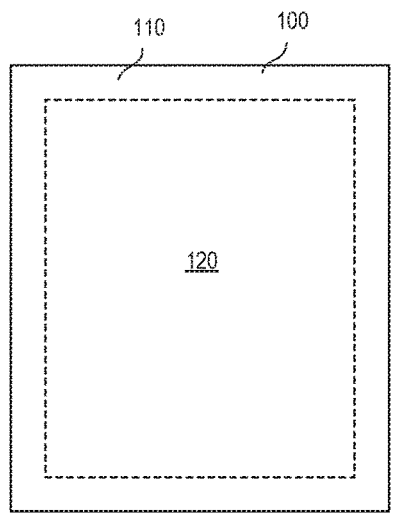
FIG. 3 shows a top of a semiconductor body according to one example of the semiconductor arrangement.

Referring to FIG. 3, which shows a top view of the first surface 101 of a semiconductor body 100 according to one example, the edge region 110 surrounds the inner region 120 in a horizontal plane of the semiconductor body 100. The "horizontal plane" is a plane parallel to the first surface 101. Just for the purpose of illustration the semiconductor body 100 is of rectangular shape in the example shown in FIG. 3 is of rectangular shape. This, however, is only an example. The semiconductor body 100 may be implemented with any other shape, such as a circular or polygonal shape as well. In the example shown in FIG. 1, the edge surface 103 is essentially perpendicular to the first surface 101. That is, an angle between the edge surface 103 and the first surface 101 is essentially 90°. This, however, is only an example. According to another example (not shown) the edge surface is beveled so that an angle between the edge surface 103 and the first surface is different from 90°, such as between 100° and 120°.

The semiconductor body 100 may include a conventional monocrystalline semiconductor material such as silicon (Si), silicon carbide (SiC), gallium arsenide (GaAs), gallium nitride (GaN), or the like.

Referring to FIG. 1, the semiconductor arrangement further includes an attachment layer 61 spaced apart from the first surface 101 of the semiconductor body 100 in a first direction, and an intermediate layer 50 arranged between the first surface 101 of the semiconductor body 100 and the attachment layer 61. The first direction in which the attachment layer 61 is spaced apart from the semiconductor 100 equals the vertical direction z in the example shown in FIG. 1. According to one example, the attachment layer 61 is configured to have at least one electronic device attached thereto. An "electronic device" as used herein may include an integrated circuit with a plurality of semiconductor devices, or a discrete semiconductor device such as a transistor. According to one example, the attachment layer 61 is a solder layer and configured to have the at least one electronic device attached thereto by soldering. The attachment layer 61 may include a layer stack with an adhesion layer that adjoins the intermediate layer 50, a solder layer on top of the adhesion layer, and a protection layer that protects the solder layer from corrosion such as oxidation. The adhesion layer may include at least one of titanium (Ti) or chromium (Cr), the solder layer may include at least one of nickel (Ni) and platinum (Pt), and the protection layer may include one of gold (Au) and silver (Ag). Optionally, a passivation layer P such as a nitride layer covers the attachment layer 61 and those sections of the intermediate layer 50 not covered by the attachment layer 61. The passivation layer may be removed or opened above those sections of the attachment layer 61 where a semiconductor device (not shown in the figures) is attached to the attachment layer 61.

Like the semiconductor body 100 the semiconductor arrangement as a whole includes an edge surface, an inner region and an edge region. The edge surface of the semiconductor arrangement includes the edge surface 103 of the semiconductor body 100) and a surface of the intermediate layer 50 adjoining the edge surface 103 of the semiconductor body 100. The inner region of the semiconductor arrangement includes the inner region 120 of the semiconductor body 100 and those other sections of the semiconductor arrangement that adjoin the inner region 120 of the semiconductor body 100 in the first direction, that is, the vertical direction z. The edge region of the semiconductor arrangement includes the edge region 110 of the semiconductor body 100 and those other sections of the semiconductor arrangement that adjoin the edge region 110 of the semiconductor body 100 in the first direction.

FIG. 1 shows a vertical cross-sectional view of one section of the semiconductor arrangement. As used herein, a "vertical cross-sectional view" is a view in a vertical section plane perpendicular to the first surface 101 of the semiconductor body 100, while a horizontal cross-sectional view is a view in a section plane parallel to the first surface 101. The section of the semiconductor arrangement shown in FIG. 1 includes the edge region and one section of the inner region of the semiconductor arrangement. Referring to FIG. 1, the semiconductor arrangement further includes a first type sealing structure S1 (other types of sealing structures are explained further below). This first type sealing structure S1 is configured to prevent or at least reduce a diffusion of impurity atoms from outside the semiconductor arrangement into the inner region 120 of the semiconductor body 100. In particular, the first sealing structure forms a barrier between the inner region 120 of the semiconductor body 100 and the edge surface of the semiconductor arrangement so as to prevent impurity atoms from diffusing via the edge surface of the semiconductor arrangement into the inner region 120 of the semiconductor body 100.

Referring to FIG. 1, the first type sealing structure includes a first barrier 20, a second barrier 30, and a third barrier 40. The first barrier 20, the second barrier 30 and the third barrier 40 are arranged in the intermediate layer 50 above the first surface 101. In particular, the first barrier 20, the second barrier 30 and the third barrier 40 are arranged in the intermediate layer 50 in the edge region of the arrangement, that is, above the edge region 110 of the semiconductor body 100.

Referring to FIG. 1, the first barrier 20 is spaced apart from the attachment layer 61 in the first direction of the semiconductor arrangement (which is the vertical direction z in this example). The second barrier 30 adjoins the attachment layer 61 and this is spaced apart from the first barrier 20 in a second direction. This second direction is different from the first direction and, according to one example, is perpendicular to the first direction. In the example shown in FIG. 1, the second direction equals the first horizontal direction x. The third barrier 40 adjoins the first barrier 20 and the second barrier 30 and extends from the first barrier 20 to the second barrier 30 in the second direction.

Optionally, the semiconductor arrangement includes a fourth barrier 10 (illustrated in dashed lines in FIG. 1) arranged in a trench that extends from the first surface 101 into the semiconductor body 100. Further, the fourth barrier 10 is spaced apart from the edge surface 103 in the horizontal direction of the semiconductor body 100. According to one example, the fourth barrier 10 includes an electrically conducting first barrier layer 11 that is electrically or dielectrically insulated from the semiconductor body 100 by a second barrier layer 12. According to one example, the first barrier layer 11 includes a metal, such as tungsten (W), or a highly doped polycrystalline semiconductor material, such as polysilicon. The second barrier layer 12 includes, for example, an oxide, a nitride, an oxynitride or the like.

Referring to FIG. 1, the first barrier 20 in the intermediate layer extends down to a level of the first surface 101 of the semiconductor body 100. At this level of the first surface 101 the first barrier adjoins a semiconductor region of the semiconductor body 100 if the fourth barrier is omitted. If the semiconductor arrangement includes the fourth barrier the first barrier 20 adjoins the first barrier layer 11 of the fourth barrier 10 and is electrically connected thereto.

According to one example, each of the first barrier 20 and the second barrier 30 is electrically conducting and the third barrier 40 is electrically or dielectrically insulating. According to one example, each of the first barrier 20 and the second barrier 30 includes at least one type of metal and/or at least one type of metal nitride. Examples of the at least one type of metal includes include copper (Cu), aluminum (Al), tungsten (W), titanium (Ti), or tantalum (Ta).

Examples of the at least one type of metal nitride includes titanium nitride (TiN), or tantalum nitride (TaN). According to one example, the third barrier 40 includes a nitride such as silicon nitride.

As can be seen from FIG. 1, the first type sealing structure S1 extends from the attachment layer 61 through the intermediate layer 50 into the semiconductor body 100. By virtue of the third barrier 40, which is electrically or dielectrically insulating, the attachment layer 61 is electrically or dielectrically insulated from the fourth barrier 10 that extends into the semiconductor body 100 and the first barrier 20. This insulation makes it possible for the attachment layer 61 to have an electrical potential different from an electrical potential of the first barrier 20 and the conducting section 11 of the optional fourth barrier 10. According to one example, during operation of the semiconductor arrangement, the edge region 110 of the semiconductor body 100 is connected to a reference potential such as ground GND, and the first barrier 20 is connected to the same reference potential GND. This is illustrated in dashed lines in FIG. 1, wherein connections to the reference potential are only schematically illustrated. By this, there is no or no significant voltage between the semiconductor body 100 and the first barrier 20. Such voltage would be associated with an electric field that might promote a movement of impurities into the semiconductor body 100, in particular a region of the edge region 110 that is located between the optional fourth barrier 10 and the inner region 120. Further, by virtue of the insulation, the attachment layer 61, in the horizontal direction, may overlap the edge region 110 of the semiconductor body 100 and the first sealing structure S1. In particular, the attachment layer 61 may completely overlap the first sealing structure S1, that is, the attachment layer 61 in the lateral direction may extend towards the edge surface to such an extent that it completely overlaps the first barrier 20 and the optional fourth barrier 10. The attachment layer 61 can therefore be implemented with a larger area than an attachment layer in a conventional semiconductor arrangement in which the sealing structure is electrically conducting throughout the intermediate layer so that an attachment layer must not overlap the sealing structure.

Figure 2:
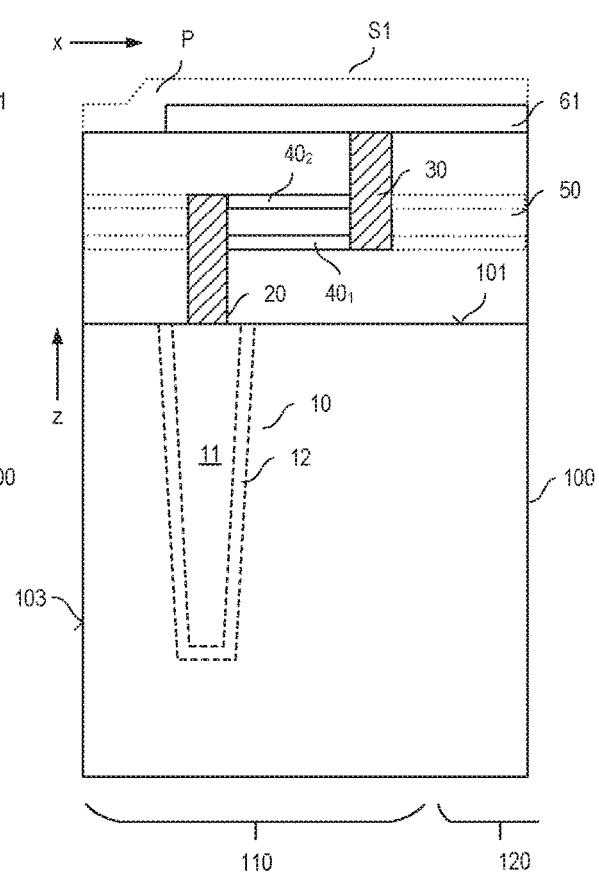
FIG. 2 shows a vertical cross-sectional view of a semiconductor arrangement that includes a first type sealing structure according to another example.

FIG. 2 shows a modification of the first type sealing structure shown in FIG. 1. In the example shown in FIG. 2, the third barrier 40 includes two barrier layers $40_1$, $40_2$ that are spaced apart from each other in the first direction. Each of these two barrier layers $40_1$, $40_2$ adjoins the first barrier 20 and the second barrier 30 and extends from the first barrier 20 to the second barrier 30 in the second direction. Referring to what is illustrated in dotted lines in FIG. 2, the two barrier layers $40_1$, $40_2$ may not only extend between the first barrier 20 and the second barrier 30, but may additionally extend between the first barrier 20 and the edge surface 103 and from the second barrier 30 towards the inner region 120.

Figure 4:
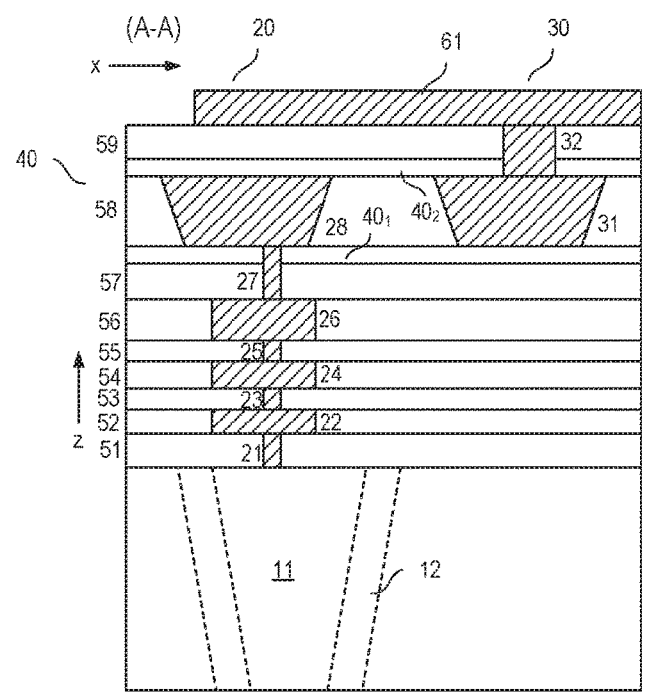
FIG. 4 shows one example of a first type sealing structure of the type shown in FIG. 2 in greater detail.

FIG. 4 shows in greater detail one example of the intermediate layer 50, the first barrier 20 and the second barrier 30 in a first type sealing structure of the type shown in FIG. 2. From the optional fourth barrier 10 only a section is shown in FIG. 4.

In the example shown in FIG. 4, the intermediate layer 50 includes a plurality of sub-layers 51-57. Further, the first barrier 20 includes a plurality of barrier segments 21-28 that are stacked one above the other. Each of these barrier segments 21-28 is arranged in a corresponding sublayer of the intermediate layer 50, wherein one sublayer 59 is arranged between the first barrier 20 and the attachment layer 61. In the example shown in FIG. 4, the second layer $40_2$ of the third barrier adjoins the first barrier 20, and sublayer 59 is arranged between the second layer $40_2$ and the attachment layer 61. A barrier segment 28 that is most distant to the first surface 101 in the first barrier 20 is referred to as uppermost segment 28 in the following. In the present example, this uppermost segment 28 is located between the first layer $40_1$ and the second layer $40_2$ of the third barrier and is electrically connected to the other segments via a segment 27 that adjoins the uppermost segment 28 and extends through the second layer $40_2$ of the third barrier 40. The second barrier 30 also includes several segments 31-32 (two in in the example shown in FIG. 4) stacked one above the other. An uppermost segment 32 of these segments adjoins the attachment layer 61. A lowermost segment 31 of these segments is arranged between the first and second layers $40_1$, $40_2$ of the third barrier 40. Each of the segments 21-28 and 31-32 of the second and second barriers 20, 30 is electrically conducting so that these barriers 20, 30, as a whole, are electrically conducting. According to one example, the uppermost segment 28 of the first barrier 20 is a copper layer, the lowermost segment 31 of the second barrier 31 is a copper layer, and at least some of the other segments 21-27 of the first barrier 20 are aluminum layers. According to one example, the other segments 21-27 of the first barrier include aluminum layers and tungsten layers, in particular, a segment 27 adjoining the uppermost layer 28 may be a tungsten layer.

Referring to the above, the insulating third barrier 40 makes it possible for the first barrier 20 on the one hand and the attachment layer 61 and the third barrier 30 connected to the attachment layer 61 on the other hand to have different potentials. According to one example, the uppermost segment 28 of the first barrier 20 and the lowermost segment 31 of the second barrier are power supply lines so that during operation of the semiconductor arrangement the uppermost segment 28 of the first barrier 20 (which is referred to as first supply line in the following) is connected to a first supply potential, such as reference or ground potential GND, and the lowermost segment 31 of the second barrier 30 (which is referred to as second supply line in the following) is connected to a second supply potential different from the first supply potential. In this example, the semiconductor arrangement includes supply pads (not shown in FIG. 4) to which the first and second supply lines 28, 31 are connected and which serve to receive a supply voltage from an external power source. Examples of where those supply pads may be arranged are explained with reference to FIGS. 6A and 10A herein further below. These supply lines 28, 31 may be connected to electronic devices integrated in the inner region of the semiconductor body 100 via connections that extend through the intermediate layer 50. Such connections, however, are out of view in the section plane shown in FIG. 4.

Above the inner region 120 conductors (not shown in the figures) may be formed in the layer stack of the intermediate layer 50. Some of those conductors may connect different device integrated in the semiconductor body 100, others of those conductors may connect devices integrated in the semiconductor body 100 with contact pads embedded in the attachment layer 61. Examples of those contact pads are explained with reference to FIG. 11 below. And others of those conductors may connect devices integrated in the semiconductor body 100 with the power supply lines 28, 31. The segments of the second and second barrier 20, 30 are produced in the same process steps in which these conductors (or interconnections) are formed. According to one example, the first and second layers $40_1$, $40_2$ of the third barrier 40 extend over the entire arrangement above the edge region 110 and the inner region 120 of the semiconductor body 100, wherein electrical connections, such as segment 27 of the first barrier 20 or some of the conductors mentioned above may go through these layers 40$_1$, 40$_2$.

Figure 5:
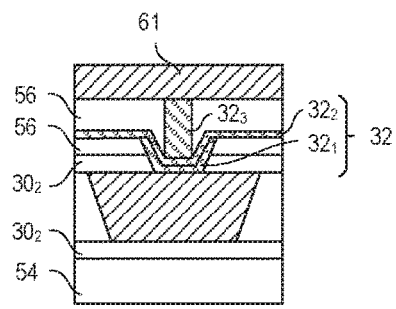
FIG. 5 shows one example of an electrical connection of the first type sealing structure shown in FIG. 4.

Referring to FIG. 5, the uppermost segment 32 of the second barrier 30 may include a layer stack with two or more layers stacked one above the other. In the example shown in FIG. 5, the uppermost segment 32 includes three layers 32$_1$, 32$_2$. These layers are selected such that the uppermost segment 32 provides an electrical connection between the lowermost layer 31 of the second barrier 30 and the attachment layer 61 and such that corrosion effects are prevented. According to one example, the lowermost layer 31 of the second barrier 30 is a copper layer, a first layer 32$_1$ of the uppermost segment 32 is a nitride layer such as a tantalum nitride (TaN) layer, a second layer 32$_2$ is an aluminium (Al) layer, and a third layer 32$_3$ is a tungsten (W) layer.

According to one example, the first type sealing structure explained before completely surrounds the inner region 120 of the semiconductor body. That is, a first type sealing structure as explained before forms a closed loop around the inner region in the edge region of the semiconductor arrangement.

Figure 6A:
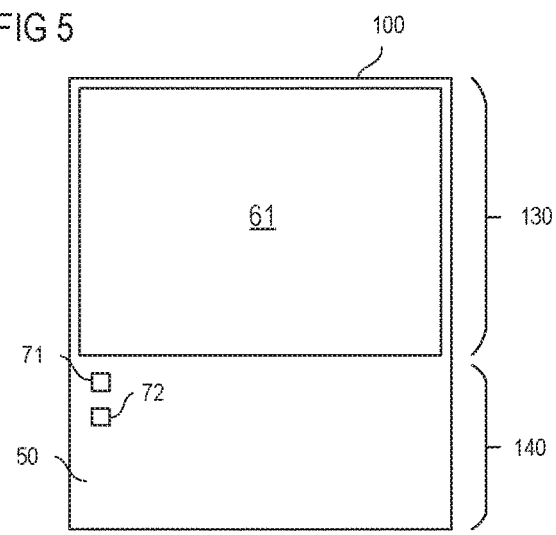
FIGS. 6A and 6B show a top view and a horizontal cross-sectional view, respectively, of a semiconductor arrangement according to one example that includes a first type sealing structure, a second type sealing structure, and a third type sealing structure.
Figure 6B:
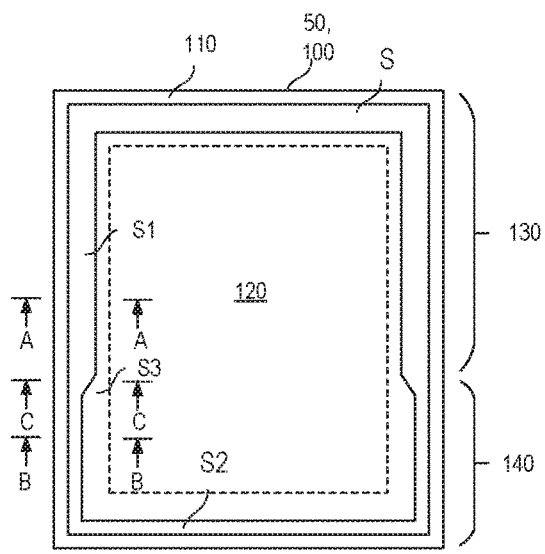

FIGS. 6A and 6B show a top view and a horizontal cross-sectional view, respectively, of a semiconductor arrangement according to another example. In this example, referring to FIG. 6A, the attachment layer 61 is arranged above a first region 130, but not a second region 140 of the semiconductor body 100. In this example, the semiconductor arrangement includes a sealing structure S arranged in the edge region and forming a closed loop around the inner region. This is illustrated in FIG. 6B, which shows a horizontal cross-sectional view of the intermediate layer 50. The sealing structure S is only schematically shown in FIG. 6B.

Referring to FIG. 6B, the sealing structure S includes a first type sealing structure as explained before only in the first region 130 where the attachment layer 61 is located. In the second region 140, where the attachment layer 61 is omitted, the semiconductor arrangement includes a second type sealing structure S2, wherein a third type sealing structure S3 "links" the first type sealing structure S1 and the second type sealing structure S2. FIG. 6B illustrates the positions of three different vertical section planes A-A, B-B, C-C. A first section plane A-A is at a position where the overall sealing structure S includes the first type sealing structure S1. According to one example, the first type sealing structure is of the type explained with reference to FIG. 4, so that FIG. 4 may represent a vertical cross-sectional view of the semiconductor arrangement shown in FIG. 6B in the first section plane A-A.

Figure 7:
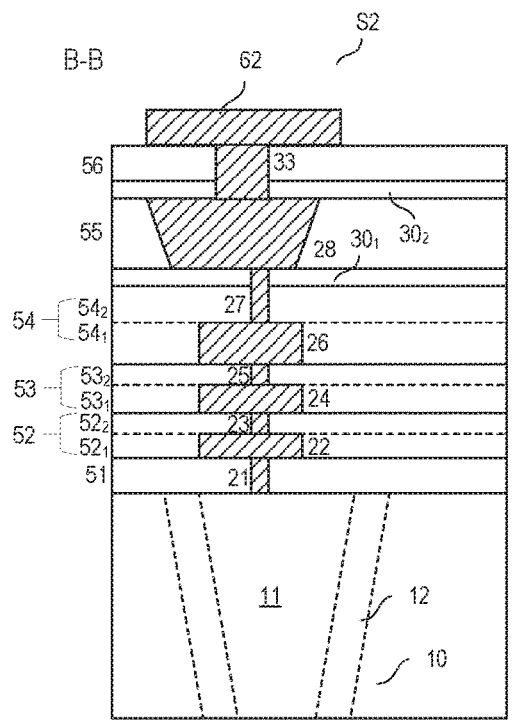
FIG. 7 shows a vertical cross-sectional view of the second type sealing structure according to one example.

One example of the second type sealing structure S2, that is, one example of a vertical cross-sectional view in the second section plane B-B is shown in FIG. 7. In this example, the second type sealing structure S2 includes the first barrier 20, wherein the first barrier 20 in the second type sealing structure is electrically connected to a conducting layer 62 on top of the intermediate layer 50. A contact plug 63 connects the first barrier 20 to the conducting layer 62 on top of the intermediate layer 50.

Figure 8:
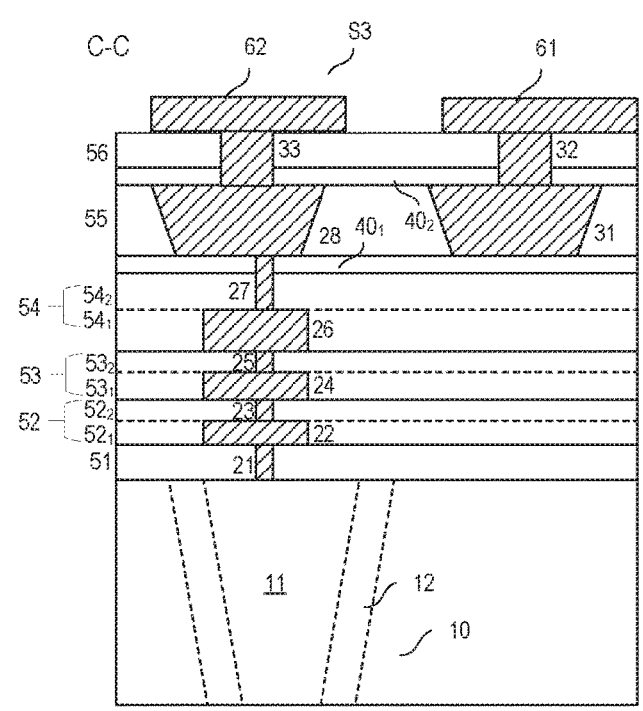
FIG. 8 shows a vertical cross-sectional view of the third type sealing structure according to one example.

FIG. 8 shows one example of the third type sealing structure S3, that is, FIG. 8 shows one example of a vertical cross-sectional view in section plane C-C shown in FIG. 6B. Referring to FIG. 8, the third type sealing structure S3, which links the first type sealing structure S1 and the second type sealing structure S2, includes the first barrier 20 connected to the conducting layer 62 on top of the intermediate layer 50 by contact plug 63. Further, the third type sealing structure includes a section of the attachment layer 61, wherein this section of the attachment layer 61 is spaced apart from the conducting layer in the second horizontal direction y. the third type sealing structure S3 further includes the second barrier 30 connected to the attachment layer 61.

Figure 9:
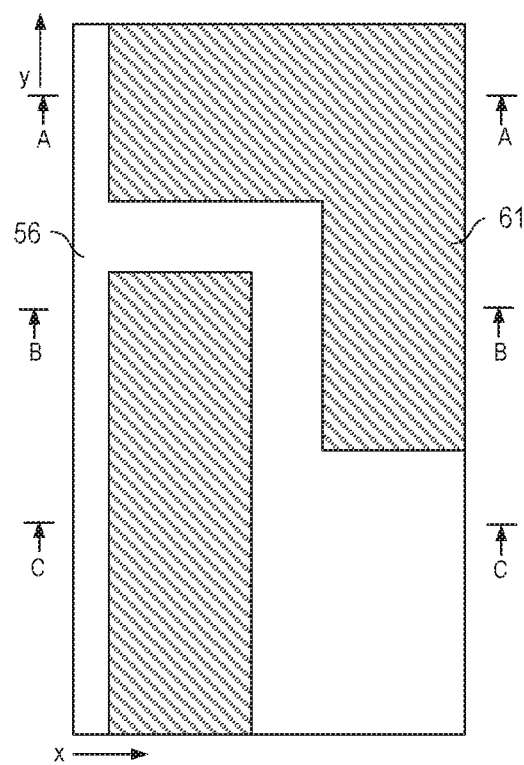
FIG. 9 shows a horizontal cross-sectional view of the second type sealing structure and adjacent sections of the first type sealing structure and the third type sealing structure in a semiconductor arrangement of the type shown in FIG. 6B.

FIG. 9 shows an enlarged top view of the sealing structure S in a region that includes the third type sealing structure S3 and adjacent sections of the first type sealing structure S1 and the second type sealing structure S2. As can be seen from FIG. 9, the conducting layer 62 is not only spaced apart from the attachment layer 61 in the second direction (which is the first lateral direction x in this example) but also a third direction different from the first and second directions. This third direction equals a second lateral direction y perpendicular to the first lateral direction in this example. In the sealing structure explained with reference to FIGS. 6A-6B and 7-9 the first barrier 20 and the optional fourth barrier 10 form a closed loop around the inner region of the semiconductor arrangement while the second barrier 30 ends between the third type sealing structure S3 and the second type sealing structure S2.

Referring to the above, the first barrier 20 and the second barrier 30 may include power supply lines, such as layers 28 and 31 shown in FIG. 4, connected to supply pads. According to one example, these supply pads are located on top of the intermediate layer 50 in the second region 140, which is the region where the intermediate layer 50 is not covered by the attachment layer 50. This is schematically illustrated in FIG. 6A. In this example, a first supply pad 71 and a second supply pad 72 are located on top of the intermediate layer 50. One of these supply pads 71, 72 is connected to one of the supply lines 28, 31 and the other one of these supply pads 71, 72 is connected to one of the supply lines 28, 31. The supply lines 28, 31 and connections between the supply lines 28, 31 and the supply pads 71, 72 are out of view in FIG. 6A. The connections may include vias and/or lateral conductors that extend, in the intermediate layer 50, from the supply pads 71, 72 to the respective supply line 28, 31. An external power source (not shown) may be connected to the supply pads 71, 72 through bond wires (not shown).

Figure 10A:
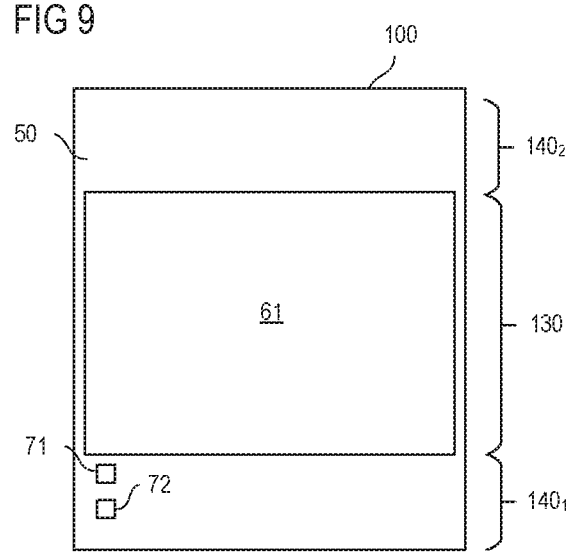
FIGS. 10A and 10B show a top view and a horizontal cross-sectional view, respectively, of a semiconductor arrangement according to another example that includes a first type sealing structure, a second type sealing structure, and a third type sealing structure.
Figure 10B:
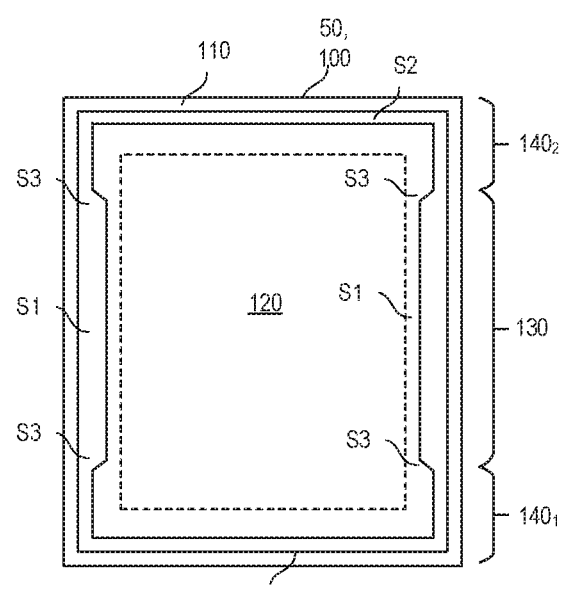

FIGS. 10A and 10B show a top view and a horizontal cross-sectional view of a semiconductor arrangement according to another example. This semiconductor arrangement is a modification of the semiconductor arrangement shown in FIGS. 6A and 6B and is different from the semiconductor arrangement shown in FIGS. 6A and 6B in that it includes two regions 1401, 1402 where the attachment layer 61 is omitted. Thus, there are two regions where the semiconductor arrangement includes a second type sealing structure S2, wherein these second type sealing structures S2 are linked to sections of the first type sealing structure S1 by third type sealing structures S3.

Figure 11:
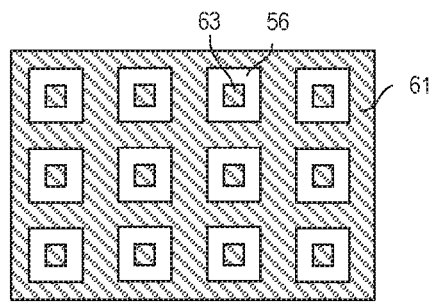
FIG. 11 shows a top view of one section of an attachment layer according to one example.

FIG. 11 shows a top view of one section of the attachment layer 61 arranged above the inner region of the semiconductor body 100 and the semiconductor arrangement, respectively. In this example the attachment layer 61 includes a plurality of contact openings, wherein each of these contact openings includes a contact pad 63 that is dielectrically insulated from the attachment layer 61 by an insulation layer 57. Each of these contact pads 63 may be connected to an electronic circuit integrated in the inner region 120 of the semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement, comprising:
   a semiconductor body with a first surface, an inner region and an edge region, the edge region surrounding the inner region;
   an attachment layer spaced apart from the first surface of the semiconductor body in a first direction;
   an intermediate layer arranged between the first surface of the semiconductor body and the attachment layer;
   an electrically conducting layer on top of the intermediate layer and spaced apart from the attachment layer; and
   a sealing structure, comprising:
      a first barrier arranged in the intermediate layer;
      a second barrier arranged in the intermediate layer, the second barrier adjoining the attachment layer, being spaced apart from the first surface in the first direction and being spaced apart from the first barrier in a second direction; and
      a third barrier extending from the first barrier to the second barrier in the second direction,
   wherein the sealing structure forms a barrier between the inner region of the semiconductor body and an edge surface of the semiconductor arrangement so as to prevent impurity atoms from diffusing via the edge surface of the semiconductor arrangement into the inner region of the semiconductor body,
   wherein the second barrier is arranged between the inner region of the semiconductor body and the first barrier region so that the first barrier region is closer to the edge surface of the semiconductor arrangement than the second barrier region,
   wherein each of the first barrier and the second barrier is electrically conducting,
   wherein in a first type sealing structure of the sealing structure, the first barrier is spaced apart from and overlaps the attachment layer in the first direction,
   wherein in a second type sealing structure of the sealing structure, the first barrier is connected to the electrically conducting layer.

2. The semiconductor arrangement of claim 1, further comprising a fourth barrier arranged in a trench extending from the first surface into the semiconductor body, wherein the first barrier adjoins the fourth barrier.

3. The semiconductor arrangement of claim 2, wherein the fourth barrier comprises an electrically conducting first barrier layer that is electrically or dielectrically insulated from the semiconductor body by a second barrier layer.

4. The semiconductor arrangement of claim 1, wherein the third barrier is electrically or dielectrically insulating.

5. The semiconductor arrangement of claim 1, wherein at least one of the first barrier and the second barrier includes a plurality of segments stacked one above the other.

6. The semiconductor arrangement of claim 1, wherein the sealing structure forms a closed loop along the edge surface.

7. The semiconductor arrangement of claim 1, wherein a third type sealing structure of the sealing structure is arranged between the first type sealing structure and the second type sealing structure.

8. The semiconductor arrangement of claim 7, wherein the first type sealing structure, the second type sealing structure and the third type sealing structure together form a closed loop.

9. The semiconductor arrangement of claim 8, wherein the closed loop comprises one first type sealing structure, one second type sealing structure, and two third type sealing structures.

10. The semiconductor arrangement of claim 8, wherein the closed loop comprises two first type sealing structures that are spaced apart from each other, two second type sealing structures that are spaced apart from each other, and four third type sealing structures.

11. The semiconductor arrangement of one of claim 7, wherein each of the second type sealing structure and the third type sealing structure comprises the third barrier.

12. The semiconductor arrangement of claim 1, wherein the third barrier comprises at least one nitride layer.

13. The semiconductor arrangement of claim 1, wherein the third barrier comprises a first layer and a second layer spaced apart from each other in the first direction, wherein the first barrier comprises a segment arranged between the first layer and the second layer of the third barrier, and wherein the second barrier comprises a segment arranged between the first layer and the second layer of the third barrier.

14. The semiconductor arrangement of claim 13, wherein at least one of the segments of the first barrier and the second barrier arranged between the first layer and the second layer of the third barrier is a copper layer.

15. The semiconductor arrangement of claim 14, wherein a thickness of the copper layer is in a range between 1 micrometer and 10 micrometers.

16. The semiconductor arrangement of claim 13, wherein the segment of the first barrier arranged between the first layer and the second layer of the third barrier is connected to a first supply pad, and wherein the segment of the second barrier arranged between the first layer and the second layer of the third barrier is connected to a second supply pad different from the first supply pad.

17. The semiconductor arrangement of claim 13, wherein the segment of the first barrier arranged between the first layer and the second layer of the third barrier forms a closed loop.

18. The semiconductor arrangement of claim 1, wherein the attachment layer comprises:
   an adhesion layer on top of the intermediate layer;
   a solder layer on top of the adhesion layer; and
   a protection layer on top of the solder layer.

* * * * *